United States Patent [19]

Abe et al.

[11] Patent Number: 4,833,287
[45] Date of Patent: May 23, 1989

[54] SINGLE-TURN INDUCTION HEATING COIL FOR FLOATING-ZONE MELTING PROCESS

[75] Inventors: Takao Abe, Annaka; Shyouzo Muraoka, Saigo, both of Japan

[73] Assignee: Shin-Etsu Handotai Co., Ltd., Tokyo, Japan

[21] Appl. No.: 171,443

[22] Filed: Mar. 21, 1988

[30] Foreign Application Priority Data

Apr. 27, 1987 [JP] Japan ................... 62-102069
Jul. 3, 1987 [JP] Japan ................... 62-165247

[51] Int. Cl.⁴ .................................................. H05B 6/40
[52] U.S. Cl. ............................. 219/10.79; 219/10.43; 373/139; 336/223; 336/232
[58] Field of Search .............. 219/10.43, 10.79, 10.75; 373/139; 336/223, 222, 225, 226, 232

[56] References Cited

U.S. PATENT DOCUMENTS

| | | | |
|---|---|---|---|
| 2,655,588 | 10/1953 | Wadhams | 219/10.79 |
| 2,678,371 | 5/1954 | Andrew | 219/10.43 X |
| 3,031,555 | 4/1962 | Ross et al. | 219/10.79 |
| 3,607,114 | 9/1971 | Keller | 219/10.43 X |
| 3,607,138 | 9/1971 | Keller | 219/10.79 X |
| 3,827,017 | 7/1974 | Keller | 219/10.43 X |
| 4,220,839 | 9/1980 | De Leon | 219/10.43 X |

*Primary Examiner*—Philip H. Leung
*Attorney, Agent, or Firm*—Foley & Lardner, Schwartz, Jeffery, Schwaab, Mack, Blumenthal & Evans

[57] ABSTRACT

This invention relates to a single-turn induction heating coil used for floating-zone melting process. According to this invention, both ends of a single-turn coil are crossed each other in a peripheral direction of the coil so as to form an overlap section, and a pair of power supply portions are arranged on an outer peripheral wall so as to allow this RF current flowing through the coil, thereby forming a uniform magnetic field of the coil, and realizing magnetic concentration on an object. As a result, the floating-zone melting process can be stabilized to increase the productivity and striation, microscopic resistance variations and other quality defects of semiconductor crystals manufactured by the heating coil can be prevented as well.

9 Claims, 6 Drawing Sheets (A)

(B)

(A)

(B)

(C)

(A)

(B)

SINGLE-TURN INDUCTION HEATING COIL FOR FLOATING-ZONE MELTING PROCESS

BACKGROUND OF THE INVENTION

1. Field of the Invention

The present invention relates to a floating-zone melting process (to be referred to as an FZ process hereinafter), and more particularly, to an improvement of a single-turn induction heating coil used for an apparatus for manufacturing single-crystal semiconductors such as silicon, germanium and gallium phosphide.

2. Description of the Prior Art

In a conventional apparatus, for example, a rod-like polycrystalline semiconductor is held at an upper shaft and a single-crystal seed is held at a lower shaft, the lower end of the polycrystalline semiconductor is melted using an RF induction heating coil and nucleated by contacting with the top of the single-crystal seed, and then the coil and the polycrystalline semiconductor are relatively rotated and relatively moved in an axial direction while a dislocation-free crystal is prepared letting a molten zone to traverse the length of the polycrystalline semiconductor, thereby manufacturing the rod-like single-crystal semiconductor. A single-turn flat heating coil or a multiple-turn flat heating coil is used as an induction heating coil for the apparatus of this type. The single-turn heating coil is advantageous over the multiple-turn heating coil in that zone melting can be performed within a narrower region, and a large current can be obtained at a low voltage. Accordingly, the single-turn flat heating coil capable of concentratively heating a narrow region is widely used for an apparatus for manufacturing dislocation-free single crystals having a larger diameter.

In such a single-turn flat heating coil, for example, as shown in FIG. 5, an inner periphery 51 of a ring-like coil is provided with a tapered section, and end faces 53 of a coil 50 provided with a power supply portion 55 at its outer peripheral wall 52 extremely come close to each other through a gap 54 so that symmetry of a current circuit in a peripheral direction of the coil 50 is maintained, thereby obtaining a substantially uniform magnetic field (Japanese Patent Publication No. 51-24964 and the like, to be referred to as a first prior art)

However, according to the first prior art, since the slit of the coil 50 is formed along a plane perpendicular to the peripheral direction of the coil 50, even if the end faces 53 of the both ends of the coil 50 extremely come close to each other, a nonuniform magnetic field is formed thereat. In addition, since the currents flow in reverse directions to each other radially near the both end faces 53 of the coil at the gap 54, an electromagnetic field along the gap 54 is multiplied by the both currents, thereby undesirably increasing the intensity of the nonuniform magnetic field.

When relative rotation/movement of the semiconductor rod and the heating coil 50 is performed in the nonuniform magnetic field, high-impurity zones and low-impurity zones are repeatedly formed (striation) by a local temperature difference produced by the nonuniform magnetic field in each growth cycle per revolution. If a device is manufactured by using a wafer having such striation, microscopic resistance variations generated at a portion having the striation results in product defects.

In general, the single-crystal semiconductor is manufactured by the FZ process in a protective gas atmosphere using an argon gas or the like. Therefore, as shown in FIG. 6, turbulence of the protective gas occurs near a melting zone 2 of a semiconductor rod 1, and generally, a swift gas flow 3 occurs through the gap 54 along the axial direction of the semiconductor 1, so that the swift gas flow 3 tends to directly collide with a shoulder portion of a polycrystalline semiconductor 4. As a result, a collided portion is locally cooled to remain unmelted and then to grow to a spiky protrusion.

This tendency of forming such a unmelted portion is accelerated by variations in heat conduction through grain boundaries in a polycrystalline semiconductor. Furthermore, once a protrusion is formed on the outer surface, it is more easily cooled than the other part, and the protrusion is left in an icicle like shape with the lapse of time, thereby forming a so called overhang 5.

Accordingly, if the overhang 5 is produced, when the coil 50 is to be relatively moved to the polycrystalline semiconductor, the heating coil 50 cannot pass the overhang 5 because the coil 50 is physically blocked therewith. Furthermore, when the coil 50 comes close to the overhang 5, an undesirable discharge phenomenon is caused therebetween, and hence manufacturing must be stopped at that position.

In order to eliminate such drawbacks, for example, a single-turn induction heating coil such as shown in FIG. 7 is proposed in Japanese Unexamined Patent Publication (Kokai) No. 52-29644 (to be referred as to a second prior art hereinafter).

The arrangement of the second prior art will be briefly described below. In the second prior art, power supply portions 61 and 62 are formed on a coil 60 in the same manner as in the first prior art, wherein the power supply portions extend from an inner peripheral side 60a to an outer peripheral side 60b of both ends of the coil 60. However, the difference is that in the second prior art, the power supply portions 61 and 62 extend from the inner peripheral side 60a to the outer peripheral side 60b while vertically overlapping each other.

In the second prior art, however, since the power supply portions 61 and 62 are vertically overlapped, contrary to the first prior art, electromagnetic fields at the supply power portions 61 and 62 cancel each other or are attenuated from each other, so that the nonuniformity of magnetic field in the peripheral direction of the coil is not solved at all.

When the heating coil 60 is used for manufacturing a single-crystal semiconductor, in order to apply intensified magnetic field to a narrower melting zone, the inner peripheral side 60a need be thinned or wedge-shaped. However, in the second prior art, since the power supply portions 61 and 62 vertically overlap each other, and moreover, extend in the radial direction through a gap 63 between the opposite ends, it is very difficult to form the inner peripheral side 60a to be thinned or wedge-shaped. Consequently, the magnetic concentration cannot be improved.

In addition, since the power supply portions 61 and 62 function as a tube for guiding a coolant in and out, they must be formed into a hollow tubes while each having a sufficient wall thickness against a pressure of the coolant, and moreover, the gap 63 between the vertically positioned power supply portions 61 and 62 need be designed enough to prevent a discharge. Therefore, in any case, the thickness of the coil 60 in the second prior art inevitably becomes considerably large, and hence it is not suitable for an induction heating coil for floating-zone melting of single-crystal semiconductor.

SUMMARY OF THE INVENTION

The present invention has been made in consideration of the above drawbacks in the prior arts, and has its object to provide a single-turn induction heating coil capable of preventing a nonuniform magnetic field near power supply portions, thus forming a uniform magnetic field throughout the coil surfaces, and realizing a reduced thickness on the inner peripheral side.

It is another object to provide a single-turn induction heating coil capable of preventing striation and microscopic variations in resistivity throughout a single-crystal semiconductor, by realizing a uniform magnetic field and a desired magnetic concentration on the melting zone.

It is still another object to provide a single-turn induction heating coil capable of eliminating the overhang to prevent an interruption of the floating-zone melting process due to the overhang, thereby considerably improving productivity.

The above and other objects of the present invention will be more apparent from the following description of the invention and embodiments.

In order to solve such technical problems, the present invention proposes a single-turn induction heating coil having the following indispensable constituent features (1) and (2) as shown in FIGS. 1 and 2.

(1) A first aspect of the present invention is that both ends of a single-turn coil 10 are crossed each other at a predetermined crossing angle to form an overlap section 20.

In this case, preferably the overlap section 20 of the both ends of the coil is symmetrically formed in a peripheral direction of the coil, while upper and lower surfaces of the overlap section 20 have the same levels as those of the rest, thereby more easily forming the uniform magnetic field.

(2) A second aspect of the present invention is that a pair of power supply portions 19 and 29 are disposed on an outer peripheral wall of the coil 10 such that a current flowing through the coil 10 crosses over the overlap section 20 of the both ends of the coil.

More specifically, as in the second prior art, if the pair of power supply portions 61 and 62 radially extend from the inner peripheral side to the outer peripheral side of the both ends of the coil 60, the power supply portions 61 and 62 inevitably function as a part of the coil, and moreover, the power supply portions 61 and 62 cannot extend to the outer peripheral end unless they are vertically overlapped.

Therefore, main current regions having the highest density of current flowing through the power supply portions 61 and 62 are overlapped each other so that the current flowing through the coil 10 cannot cross over the overlap section 20 of the both ends of the coil, and hence the effect of the present invention described later cannot be achieved at all.

Note that it is preferable to set a mounting position of the power supply portions 19 and 29 in such a manner that a crossing angle of the main current having the highest current density and flowing through the coil 10 over the overlap section 20 becomes about 60°, and more specifically, a crossing angle α defined by lines connecting a start portion of the overlap section positioned on the inner peripheral side of the coil with centers of the power supply portions 19A and 29A at the outer peripheral wall of the coil 10 falls within the range of 40° to 70°.

Preferably, such a coil has a thickness smallest at the inner peripheral facing the melting zone, or has a tapered form from the thick outer peripheral side toward the thin inner peripheral side. However, its overall shape and sectional shape are not specifically limited, but a hollow coil body having an oval shape, star-like shape, polygonal shape, or the like.

In addition to the case wherein the heating coil is used singly, it may be used in combination with an energy concentration ring, an auxiliary heating ring for preheat or after heat, or other heating means.

The operation of the present invention will be described.

Assuming that an electromagnetic field intensity distribution of an alternating RF magnetic field generated by the RF current would be equivalent to that generated by a DC current for simplification, the effect of the present invention could be theoretically explained as follows.

Since a current tends to flow toward a conductor having a lower resistivity, and moreover, the current is an RF current, the current tends to be concentrated on a surface layer and a peripheral portion. The effect of the present invention will be analysed by examining an electromagnetic field intensity assuming that a DC current flows as shown in FIG. 1(A).

In order to simplify the explanation, an intensity of an electromagnetic field generated near a coil surface will be taken into consideration. An electromagnetic field intensity (magnetization force $|H|$) in the surface of the coil at a crossing position 20A where inner end portions of the coil slightly cross each other can be obtained as follows:

$$||H_5|| = ||H_3|| \cdot \cos[(\pi/2) - \theta] + ||H_4|| \cdot \cos[(\pi/2) - \theta]$$

where $$||H_3|| = ||H_4||$$

Consequently, $$||H_5|| = 2||H_4|| \cdot \sin\theta \qquad (1)$$

If $\theta = 30°$, then $$||H_5|| = ||H||$$

Therefore, as is understood from equation (1), when the power supply portions 19 and 29 are formed to overlap each other as in the second prior art, the magnetization force $|H_5|$ at the crossing position is inevitably reduced to a very small value because the crossing angle $2\theta$ becomes 0° or a very small angle, thereby forming a nonuniform magnetic field.

In contrast to this, in the present invention, the pair of power supply portions 19 and 29 are disposed on the outer peripheral wall of the coil 10 so as to allow the current flowing through the coil 10 to cross over the overlap section 20, and hence the currents, introduced from the power supply portions 19 and 29 after crossing each other at the inner peripheral side of the overlap section 20 or its vicinity, circulate along the verges of the coil end without overlapping each other.

Therefore, the substantially same strength of electromagnetic field can be obtained at any point on a circle at a distance from the axis at the center of the coil perpendicular to a plane parallel with the main surfaces, including the magnetic field in the vicinity of the power supply portions 19 and 29 by setting crossing angle $2\theta$ over the overlap section 20 at an appropriate angle.

More specifically, the magnetization force at the crossing position can be set to be the same value as that of the other positions by setting $\sin\theta = \frac{1}{2}$, and $\theta = \pi/6 = 30°$. Therefore, it is understood that the uniform magnetic field in the peripheral direction of the coil can be obtained by setting the crossing angle $2\theta$ in the current circuit at 60°.

Similarly, when the RF current in the present invention is taken into consideration, the above-described effect can be obtained by setting the crossing angle o defined by lines connecting the start portion 20A of the overlap section positioned on the inner peripheral side of the coil 10 with the power supply portions on the outer peripheral wall of the coil 10 at 60°. However, when the coil is increased in size to manufacture a single crystal having a large diameter, a heating resistance at the inner peripheral side of the coil is inevitably increased, and a position where the main current I flows may be gradually moved away from the inner peripheral side while the crossing position may be moved from the inner peripheral side to the outer peripheral side, e.g., moved to the maximum $\frac{1}{3}$ the length between them toward the outer peripheral side.

A crossing angle of the lines from the crossing points on the inner periphery to the points at the intersection of the center lines of the power supply portions 19A and 29A and the outer periphery is obtained by calculating the trigonometric functions with reference to a schematic view shown in FIG. 1B, in the case wherein the crossing position of the current circuit is moved to $\frac{1}{3}$ the distance between the inner peripheral side and the outer peripheral side toward the outer peripheral side, and it is about 41°.

Consequently, the crossing angle $2\theta$ of the current circuit can be set at about 60° by setting the crossing angle defined by lines connecting the start portion 20A with the power supply portions 19A and 29A within the range of about 40° to 70°, thereby smoothly achieving the effect of the present application.

According to the present invention, by crossing the directions of the RF currents at the intermediate section from the coil ends to the power supply portions, the alternating RF magnetic field surrounding the coil can be uniformly formed throughout the coil surfaces without causing the alternating RF magnetic field to have an abnormal intensity at the coil overlap section.

In a preferred embodiment of the present invention, a current distribution changing means is arranged at least on a surface of the nonoverlap section of the coil, e.g., a large number of slits 30 or vanes are formed on the coil surface along the radial direction thereof so that a large amount of current flows toward the inner peripheral side of the coil, thereby simplifying setting of the crossing angle of the current circuit. Furthermore, the uniform magnetic field in the peripheral direction can be formed easier by positioning the upper and lower extended surfaces of the coil at the overlap section 20 and at the nonoverlap section on a single plane, thereby promoting the effect of the present invention.

As is described above, since the power supply portions 19 and 29 are disposed on the outer peripheral wall 13 at the end side of the overlap section 20, a reduced thickness of the inner peripheral side of the coil can be achieved regardless of the relatively larger wall thickness of the power supply portions 19 and 29.

Furthermore, since mutually facing surfaces 14 and 24 of the both ends of the coil at the overlap section 20 are inclined in the peripheral direction, a flat, relatively thinned coil can be realized without bringing them in close proximity to each other, and hence an undesired discharge can be easily prevented.

According to the present invention, as is described above, the uniform magnetic field around the coil and a thinned profile at the inner peripheral side of the coil can be achieved while preventing the nonuniform magnetic field which otherwise is excited near the power supply portions of the single-turn induction heating coil. Consequently, striation caused by re-melting or unstable single-crystal growth locally, which occurs at the freezing front of the floating-melting zone process using the induction heating coil due to the nonuniform magnetic field, can be prevented, thereby preventing device defects due to macroscopic and microscopic resistivity variations or a so-called striation of the single crystal.

Furthermore, according to the present invention, since the overlap section 20 is formed by crossing the both ends of the coil getting away from each other in the peripheral direction, the swift gas flow on the melting zone surface along an axial direction of the semiconductor rod 1 can be prevented, and hence the overhang can be prevented and the single-crystal semiconductor can be smoothly manufactured without crystal manufacturing process interruption caused by the overhang, thereby considerably improving productivity.

BRIEF DESCRIPTION OF THE DRAWINGS

FIGS. 2(A) to 2(C) show a single-turn induction heating coil according to an embodiment of the present invention used for a single-crystal semiconductor manufacturing apparatus utilizing the FZ process, in which FIG. 2(A) is a plan view, FIG. 2(B) is a sectional view taken along line 2—2 of FIG. 2(A) and showing an overlap section side, and FIG. 2(C) is a sectional view;

DETAILED DESCRIPTION OF THE PREFERRED EMBODIMENT

A preferred embodiment of the present invention will be described with reference to the accompanying drawings. Note that the scope of the invention is not limited to the sizes, the materials, the shapes, the relative positions, and the like of the components described in the embodiment, unless otherwise specified, and that they only exemplify the invention.

Figure 1:
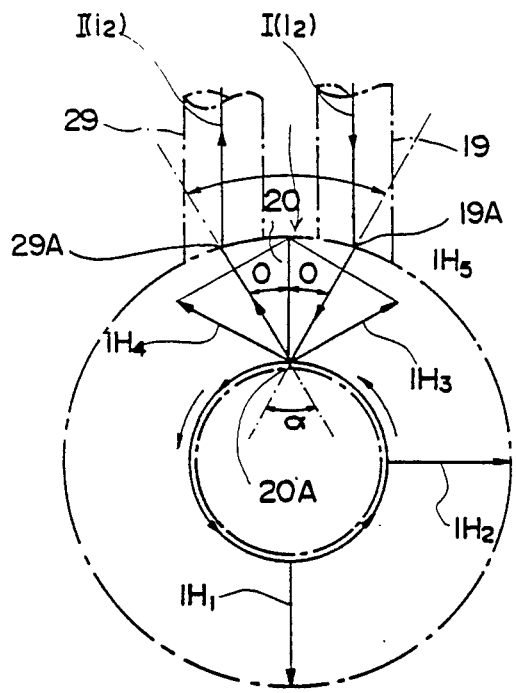
FIGS. 1A and 1B are schematic views showing a basic arrangement of the present invention.
Figure 1:
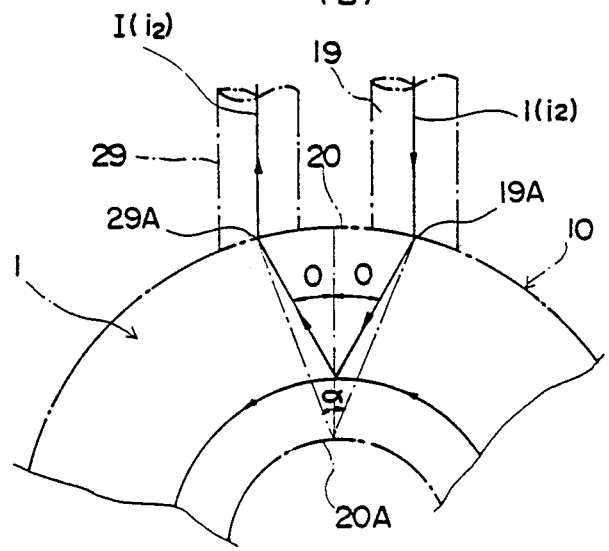
Figure 2:
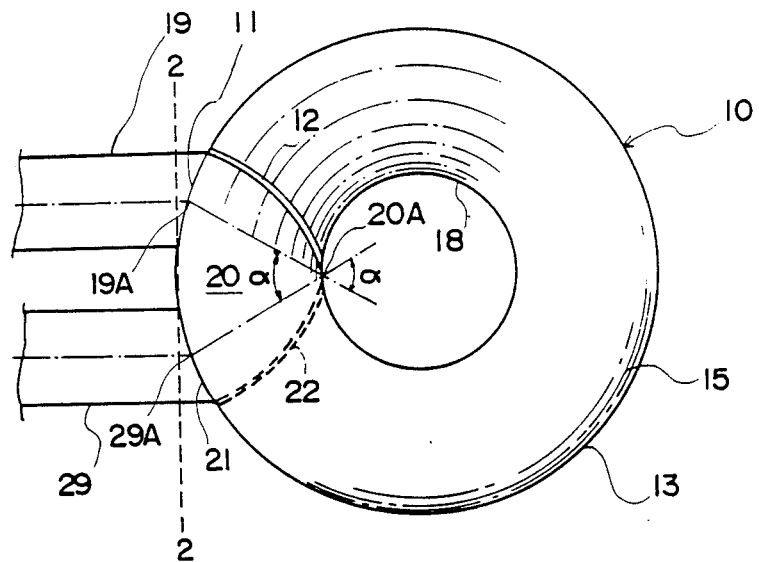
Figure 2:
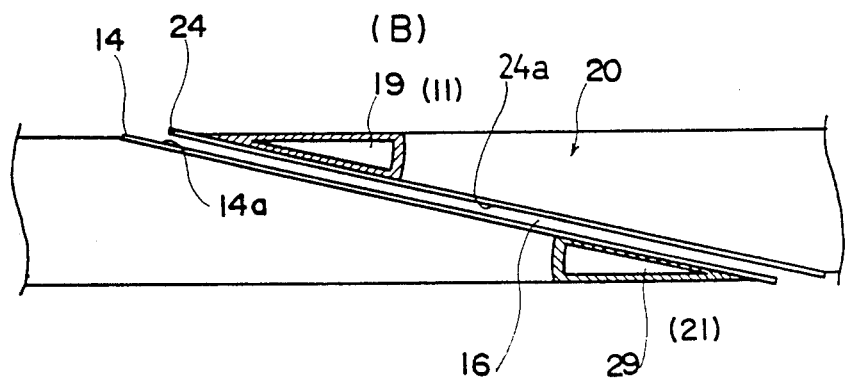
Figure 2:
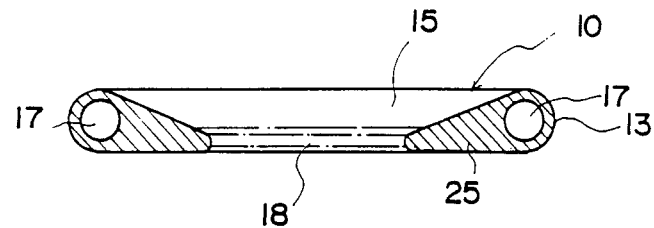

FIGS. 2(A) to 2(C) show a single-turn flat induction heating coil 10 used for the single-crystal semiconductor manufacturing apparatus utilizing the FZ process. As shown in FIG. 2(A), a copper and silver flat body having a wedge-shaped section is formed into a ring, the both end portions thereof are symmetrically crossed in a peripheral direction, and the power supply portions 19 and 29 are arrange on an outer peripheral wall of end portions 11 and 21 side of the nonoverlap section.

The shape of the coil 10 will be described.

As shown in FIG. 2(A), after the coil 10 is formed into a ring of a perfect circle, coil ends 12 and 22 in the overlap section 20 are constituted of curves near the start portion 20A of the overlap section and straight lines toward an outer peripheral wall 13 such that the coil ends 12 and 22 symmetrically expand toward the peripheral direction while the widths of the coil ends 12 and 22 and the outer peripheral wall 13 are reduced so that they form the overlap section 20 having a substantially isosceles triangle. The power supply portions 19 and 29 are respectively arranged on the outer peripheral wall at the end portions 11 and 21 of the overlap section 20, and then the power supply portions 19 and 29 parallelly and outwardly extend in the same plane as that of the coil 10.

Note that the crossing angle α defined by lines connecting the start portion 20A of the overlap section of the inner peripheral side 18 of the coil with the power supply portions 19A and 29A on the outer peripheral wall 13 of the coil 10 is arbitrarily set within the range of about 40° to 70° and preferably the range of 60° or less.

In this case, a crossing point C of the current circuit is moved outward from the inner peripheral side 18 as a ratio of the outer diameter to the inner diameter of the coil 10 is increased, and the diameter of the semiconductor rod 1 to be heated is increased. For this reason, the crossing angle defined by lines connecting the start portion 20A of the overlap section with the power supply portions 19A and 29A is preferably falls within the range of 40° to 70°.

Figure 3:
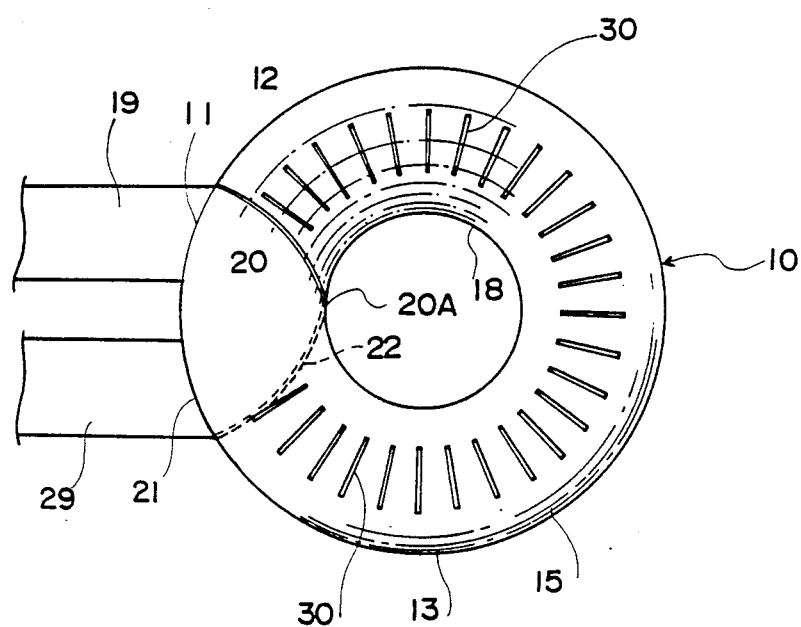
FIG. 3 is a front view showing a modification thereof.

In this case, as shown in FIG. 3, a large number of slits 30 are radially formed outward from the center excluding the inner peripheral side 18 of the coil 10, especially in the upper and lower surfaces of the nonoverlap section so as to increase a surface resistance in the slitted regions so that the main current can flow along the inner peripheral side 18. With this arrangement, magnetic concentration on the side of the semiconductor rod 1 to be heated can be improved. Furthermore, since the crossing point C of the current circuit is positioned near the start portion 20A, the crossing angle 2θ is automatically set at about 60° by setting the crossing angle α defined by lines connecting the start portion 20A of the overlap section with the power supply portions 19A and 29A at 60°.

The sectional side view of the overlap section 20, as shown in FIG. 2(B), is observed such that the wall thickness of the coil 10 is gradually reduced from the start portion 20A toward the end portions 11 and 21, and the opposite faces 14a and 24a obliquely face each other in the peripheral direction with the gap 16 between them. In this case, in order to prevent discharge in the gap 16 between which the opposite faces 14a and 24a, it is preferable to arrange plate-like members 14 and 24 on the surfaces of the opposite faces 14a and 24a so that the discharge in the gap can be prevented even if the width of the gap is considerably reduced, thereby more effectively preventing the overhang or the like. As is described above, the sectionally wedge-like tubular power supply portions 19 and 29 having a large width in the peripheral direction are arranged on wedge-like portions on the outer peripheral wall at the end portions 11 and 21 of the overlap section 20.

Note that since the coil 10 has a substantially wedge-like section in the radial direction and the thickness thereof is maximally reduced at the inner peripheral side 18, the start portion 20A opposite to the semiconductor rod 1 is extremely reduced in thickness, and hence the more uniform magnetic field can be formed around the start portion 20A.

On the other hand, as shown in FIG. 2(C), the sectional shape of the coil 10 is formed such that a through hole 17 communicating with the power supply portions 19 and 29 is formed in the outer peripheral wall 13, and lower surfaces of the both ends of the coil are totally in a plane while the upper surfaces thereof are inclined downward toward the inner peripheral side so as to form a tapered section, and an RF induction current is supplied from an RF current supply (not shown) into the coil 10 via the power supply portions 19 and 29 while a coolant is introduced from the power supply portions 19 and 29 into the through hole 17.

According to the above arrangement, in the coil 10, the overlap section 20 is formed to be symmetrical about the straight line extending through the center of the coil body 10 and the center of the start portion 20A at the inner peripheral side 18.

Figure 4:
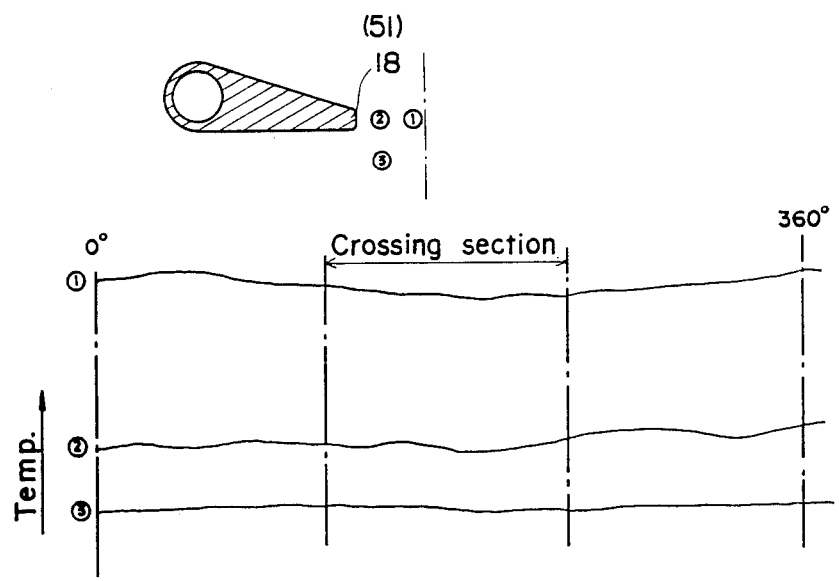
FIGS. 4(A) and 4(B) are graphs showing heating temperature distributions of both coils shown in FIGS. 2(A) to 2(C) and 5.
Figure 4:
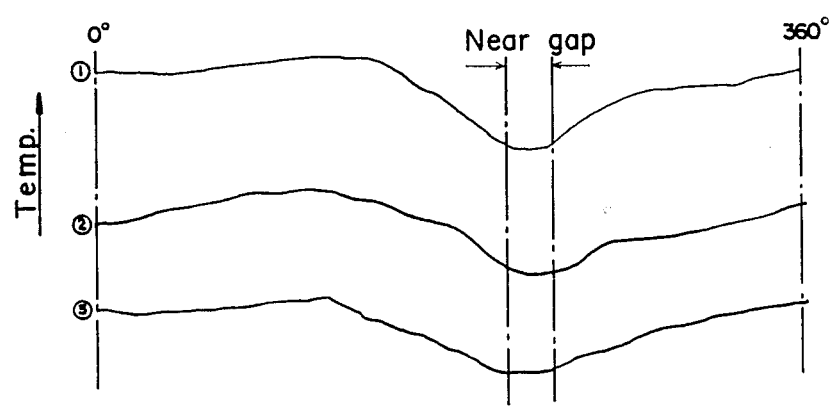
Figure 5:
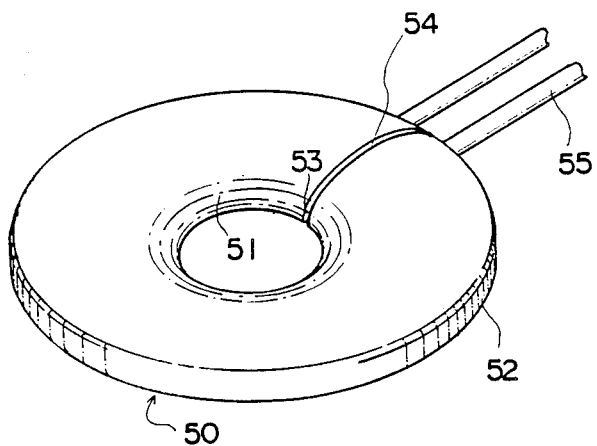
FIG. 5 is a perspective view showing a conventional single-turn induction heating coil.
Figure 6:
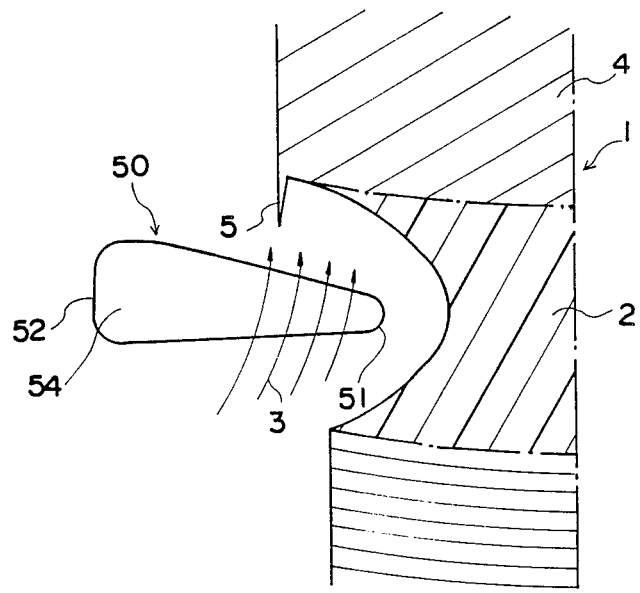
FIG. 6 is an enlarged sectional view of a main part thereof.
Figure 7:
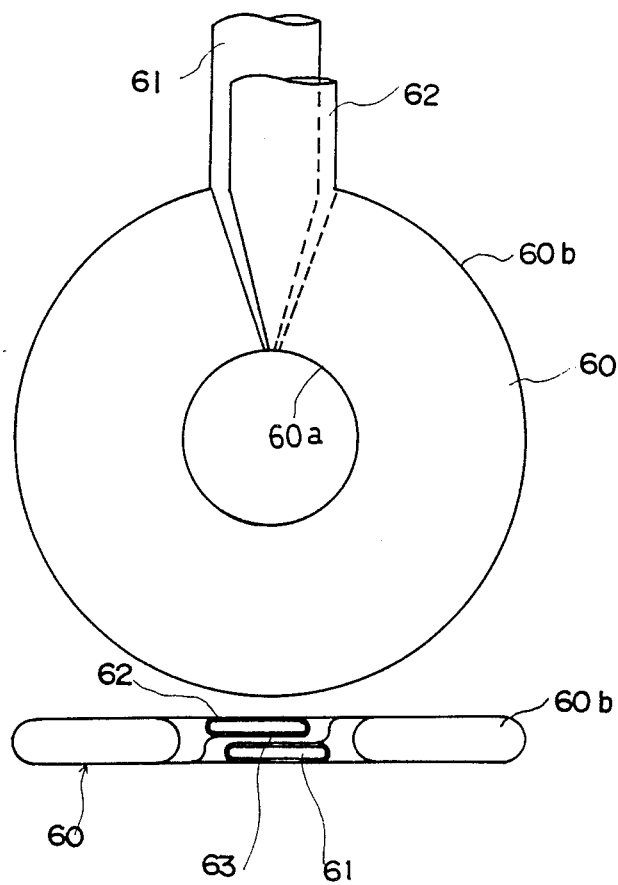
FIG. 7 is a front view showing another conventional coil.

In order to confirm the effect of the present invention, temperatures were consecutively measured at positions ( 1 , 2 , and 3 ) on the inner peripheral sides 18 and 51, where the semiconductor rods 1 are located in heating thereof, in such a manner that a distal end of a thermocoupler was disposed under the coil 10 in a noncontact state, the thermocoupler was rotated concentrically the center of the coil 10, and an RF current was supplied to the coil 10. As a result, a change in temperature apparently appeared near the gap 54 in the conventional coil 50, as shown in FIG. 4(B), but in the embodiment, it was confirmed that there was no change in temperature at any peripheral point for measuring, as shown in FIG. 2(A).

Note that if the distal end of the thermocoupler is disposed near the coil 10 in an noncontact state, a small metal ball on the distal end of the thermocoupler is heated by induced current due to the effect of an alternating RF magnetic field. The temperature can be regarded to show an intensity of the magnetic field at the position where the small ball is positioned. Therefore, a relative temperature distribution of the magnetic field can be determined by measuring electromotive force occurred in the thermocoupler. In this temperature measurement, if the thermocoupler is sufficiently long, an influence of the alternating RF current magnetic field of the coil 10 can be neglected.

As has been described above, the coil of the present invention can be used for the floating-zone melting process for manufacturing single-crystal compound semiconductor such as gallium phosphide as well as for manufacturing the single-crystal single element semiconductor such as germanium and a silicon. However, in the manufacture of a single-crystal compound semiconductor, one element is more easily volatized as compared with the other element, and hence a stoichiometrical ratio of the constituent elements should differ from that of the resultant compound semiconductor to be manufactured during the floating-zone melting process. Therefore, the inside of the floating-zone melting apparatus need be pressurized and/or especially a partial pressure of a volatile element need be increased.

What is claimed is:

1. A single-turn induction heating coil wherein both ends of a single-turn coil overlap and taper towards each other in the peripheral direction of said coil such that the end faces of the both ends of said coil face each other across a narrow gap, and wherein a pair of power supply portions are disposed on an outer peripheral wall of said coil so as to allow an RF current to flow through said coil.

2. A coil according to claim 1, wherein a crossing angle defined by the lines connecting the start position of said overlap section with said power supply portions on the outer peripheral wall of said coil falls within a range of 40° to 70°.

3. A coil according to claim 1, wherein a current distribution changing means is arranged on a surface of said coil so that a larger amount of current is confined in the inner peripheral region of said coil.

4. A coil according to claim 1, wherein said overlap section is symmetrically formed in the peripheral direction of said coil, and upper and lower exterior surfaces of said overlap section and a nonoverlap section are positioned on a substantially single plane.

5. A coil according to claim 1, wherein said end faces of the both ends of said coil at the overlapping portions are circumferentially inclined opposite to each other.

6. A single-turn induction heating coil comprising a toroid-shaped coil which tapers towards its inner edge, said coil being provided with a gap along which a pair of end surfaces of both ends of said coil face in parallel to each other and overlap each other and are diagonally disposed from the upper or lower main surface of the coil so that the coil forms a substantially perfect toroid shape, and wherein a pair of power supply portions are respectively connected at the coil ends on the outer edge side of said coil such that two imaginary straight lines connecting the center points of said power supply portions on the outer edge side of the coil intersect at a point on the inner edge side of the coil to form an angle which falls within a range of 40 to 70 degrees.

7. A single-turn induction heating coil according to claim 6, further comprising means for preventing electrical discharge in said gap, said means being affixed to permit good electrical connection on and along said end surfaces.

8. A single-turn induction heating coil according to claim 7, wherein said discharge preventing means are members for covering sharp edges formed between said end faces and the top and bottom main faces of said coil.

9. A single-turn induction heating coil according to claim 8, wherein said members for covering sharp edges are plate-like members placed on said end faces such that the end portions of said plate-like members project past the coil main surface.

* * * * *